United States Patent [19]

Stout et al.

[11] Patent Number: 5,414,592
[45] Date of Patent: May 9, 1995

[54] HEAT TRANSFORMING ARRANGEMENT FOR PRINTED WIRING BOARDS

[75] Inventors: Mark E. Stout, Plymouth; Clinton S. Vilks, Brooklyn Park, both of Minn.

[73] Assignee: Honeywell Inc., Minneapolis, Minn.

[21] Appl. No.: 291,784

[22] Filed: Aug. 17, 1994

Related U.S. Application Data

[63] Continuation of Ser. No. 38,595, Mar. 26, 1993, abandoned.

[51] Int. Cl.⁶ .............................................. H05K 7/20
[52] U.S. Cl. ................................ 361/704; 165/80.3; 211/41; 361/719; 361/796
[58] Field of Search ............... 174/16.3; 211/26, 41; 165/80.1, 80.3, 80.4, 185, 907; 361/700, 704, 705, 707, 711, 719, 728, 736, 752, 753, 796, 802, 809

[56] References Cited

U.S. PATENT DOCUMENTS

| | | | |
|---|---|---|---|
| 4,441,140 | 4/1984 | Richard | 361/386 |
| 4,867,235 | 9/1989 | Grapes | 165/185 |
| 4,994,937 | 2/1991 | Morrison | 361/386 |
| 5,057,968 | 10/1991 | Morrison | 361/385 |
| 5,184,281 | 2/1993 | Samarov | 361/386 |
| 5,224,016 | 6/1993 | Weisman | 361/388 |
| 5,287,248 | 2/1994 | Montesano | 361/708 |

*Primary Examiner*—Gerald P. Tolin
*Attorney, Agent, or Firm*—Charles J. Ungemach

[57] ABSTRACT

In the present invention, a heat transferring arrangement is disclosed for a printed wiring board assembly. A heat conductive panel is provided to be in close proximity to a component side of a printed wiring board. The heat conductive panel further includes flange members, so that the flange members may be forced against a heat conducting surface of a chassis and provide a thermally conductive contact therewith. With this arrangement, heat transfer by radiation from the circuit components to the heat conductive panel is enhanced and thereby permits heat transfer by conduction from the heat conductive panel to the chassis.

4 Claims, 3 Drawing Sheets

HEAT TRANSFORMING ARRANGEMENT FOR PRINTED WIRING BOARDS

This application is a continuation, of application Ser. No. 08/038,595, filed Mar. 26, 1993, now abandoned.

BACKGROUND OF THE INVENTION

The present invention is directed to an inexpensive way to augment the cooling of electronic components mounted on a printed wiring board.

Electronic systems have become increasingly more complex requiring multiple circuit board assemblies which may be interconnected among themselves or connected to other subsystems through cables and the like, or connected to a so-called "mother board." Because of decreasing size constraints, the chassis for enclosing a plurality of printed wiring boards has limited heat transfer by convection due to reduced air space available. Further, some applications require isolation from the environment, or the absence of air (space applications), therefore use of outside air to assist in heat transfer is not available.

Although particular components may have heat sinks attached thereto to enhance the heat transfer to the air space within the enclosure, these heat sinks generally are large, and thereby would require a greater interspacing between printed wiring boards to accommodate the size of the heat sink structure for the particular components. Further, with absence of air in some applications, heat sinks attached to the components are not effective.

One technique for dissipating heat from the electronic components is the employment of multi-layered printed wiring boards including metal layers sandwiched between the non conductive layer and the printed wiring layer.

However, such multi-layered boards are expensive and impose further limitations on manufacturing and assembly operations, and requires added weight.

SUMMARY OF THE INVENTION

An object of the present invention is to provide a heat transferring arrangement for printed wiring boards.

In the present invention, a heat transferring arrangement is disclosed for a printed wiring board assembly. A heat conductive panel having high thermal conductivity is located in close proximity to a component side of a printed wiring board. The heat conductive panel further includes flange members, so that the flange members may be placed in thermally conductive contact with a heat conducting surface of a chassis. With this arrangement, heat transfer by radiation, and secondarily by convection, from the circuit components to the heat conductive panel is enhanced, and in turn permitting heat transfer by conduction to the chassis.

The heat conductive panel, in accordance with the present invention is intended for use in passively cooled electronic boxes or chassis where internal convection is negligible. The conductive panel in accordance with the present invention provides a thermal path from the top of the electrical components to the heat conductive panel to the chassis.

As a further enhancement, in accordance with the present invention, the space remaining between the heat conductive panel and the printed wiring board may be filled with a heat conductive foam or other heat conductive medium to thereby permit heat transfer by conduction from the circuit components to the conductive foam to the heat conductive panel, and further heat transfer by conduction from the heat conductive panel to the chassis.

BRIEF DESCRIPTION OF THE DRAWINGS

FIGS. 3b–c are a top and end view, respectively, illustrating the heat transferring arrangement of the printed wiring board, heat conductive panel, and chassis interface of FIG. 3a.

DETAILED DESCRIPTION OF THE INVENTION

Figure 1:
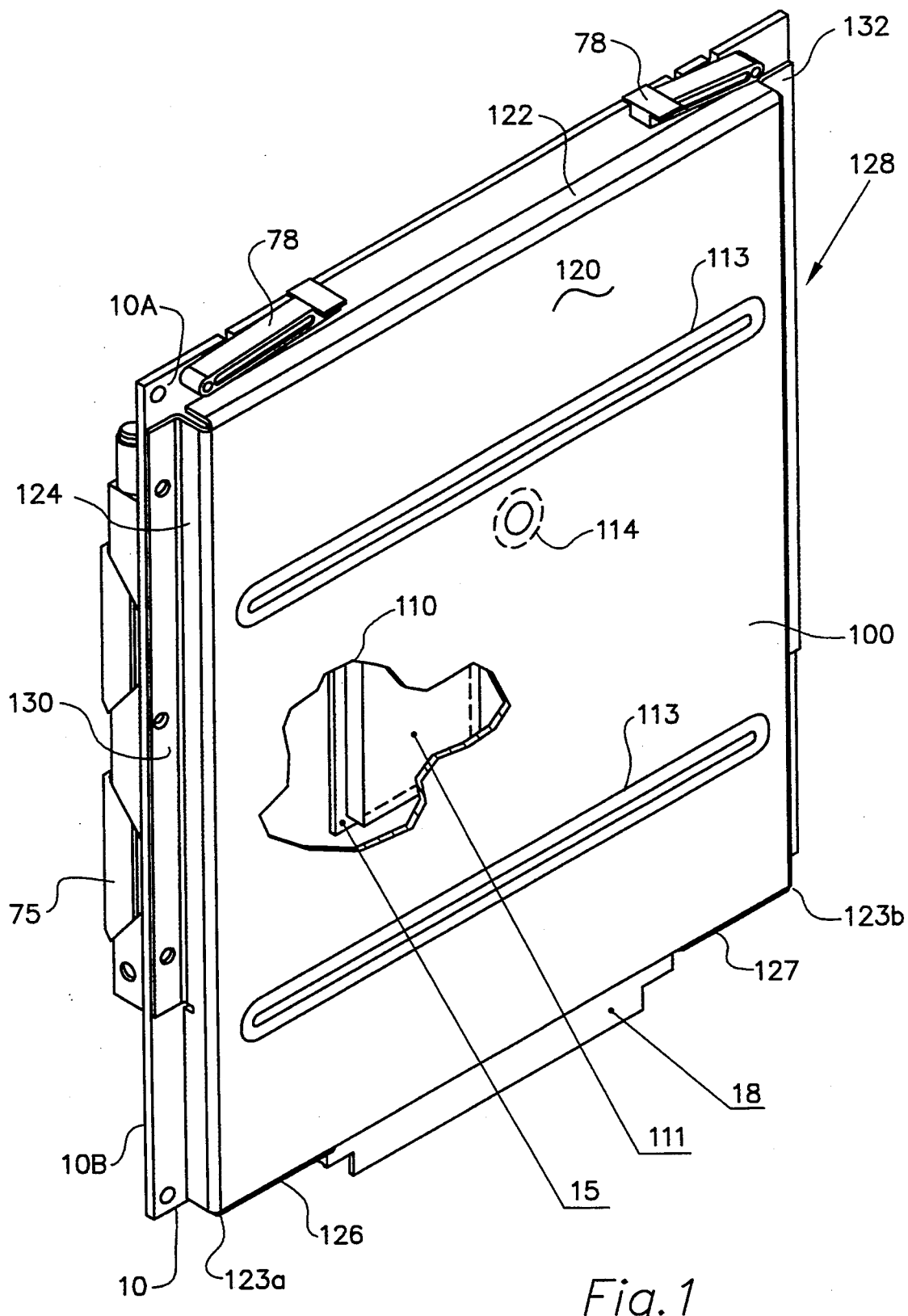
FIG. 1 is an isometric view of a heat conductive panel in combination with a printed wiring board in accordance with the present invention.

Illustrated in FIG. 1 is an isometric view of a printed wiring board 10 with a heat conductive panel 100 in accordance with the present invention. Printed wiring board 10 includes a first side 10a, visible in FIG. 1, and a second opposite side, 10b. Side 10a includes a circuit component 15 as viewed through the cut away section 110 of heat conductive panel 100. Printed wiring board 10 generally includes a plurality of components which may include analog and digital circuit components, both discrete and integrated circuit components. Also illustrated in FIG. 1 is a "wedgelock" 75 and board handles 78 attached to printed wiring board 10 commonly found in the prior art.

Heat conductive panel 100 includes an end member 120, offset from and parallel to the component side 10a of printed wiring board 10, and is generally illustrated as rectangular and planar in shape. Extending from end member 120 are a plurality wall members 122, 124, 126, 127, and 128. Wall member 122 is opposite wall members 126 and 127, and wall member 124 is opposite wall member 128. As illustrated, wall members 124 and 128 generally extend the full width of end member 120. Wall member 122 generally extends the full length of end member 120. Wall members 126 and 127 generally extend from corners 123a and 123b, respectively, of end member 120. The length of wall members 126 and 127 are selected to accommodate mounting of an electrical connector 18 that is rigidly attached to printed wiring board 10.

Heat conductive panel 100 further includes a planar flange member 130 extending from wall member 124, and having a planar surface generally in parallel with planar shaped end member 120. Similarly, heat conductive panel 100 further includes a second flange member 132 extending from wall member 128, also having a planar surface generally in parallel with planar shaped end member 120.

Figure 2:
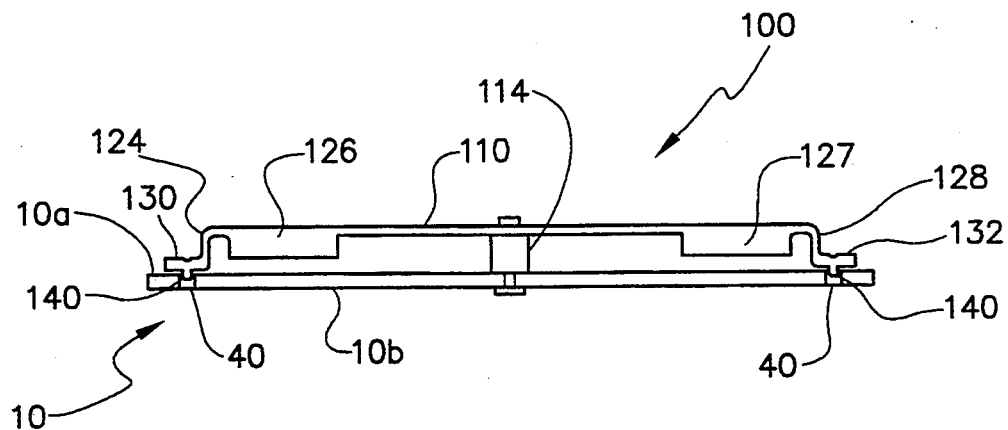
FIG. 2 is an end view of the heat conductive panel in accordance with the present invention.

Further details of heat conductive panel 100 are illustrated in FIG. 2 which is an end view of the assembly illustrated in FIG. 1. Flanges 130 and 132 include locating dimples 140 for subsequent positioning onto locating holes 40 in printed wiring board 10.

As illustrated in FIG. 2, the height dimension of wall members 122, 124, 126, 127, and 128 are such that wall members 122, 126, and 127 are in non-contact with any components on the printed wiring board 10 when both flange members are in planar contact with side 10a of printed wiring board 10. Accordingly, heat conductive panel 100 may be easily mounted to printed wiring board 10 without undue stress on the board or any circuit components, and may permit some air flow if available through the space between the heat conductive panel 100 and printed wiring board 10. It should be understood that wall members 122, 126, and 127 are not necessary in practice of the present invention. However, these latter mentioned wall members serve to strengthen the structural integrity and rigidity of the heat conductive panel and also provide some protection for preventing screws or other metallic parts falling into the space between the end member 120 and the printed wiring board 10.

Figure 3A:
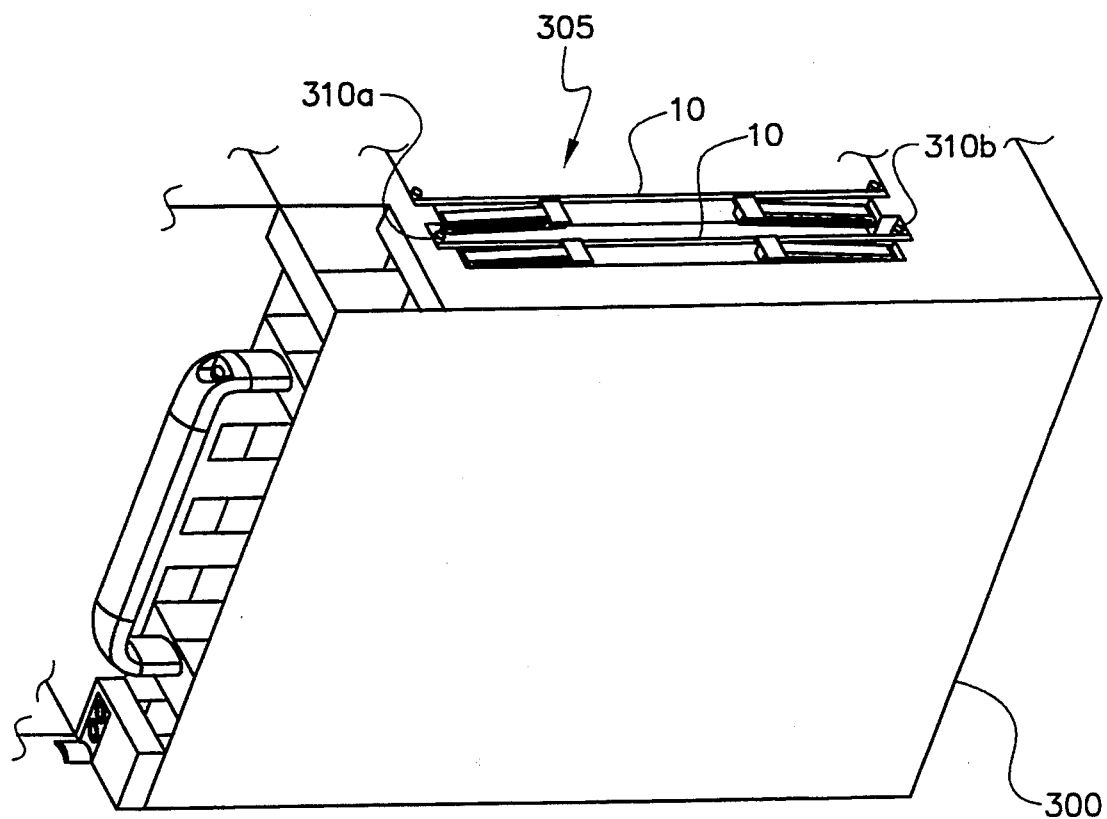
FIG. 3a is an isometric view of the heat transferring arrangement of FIG. 1 in combination with a chassis.
Figure 3B:
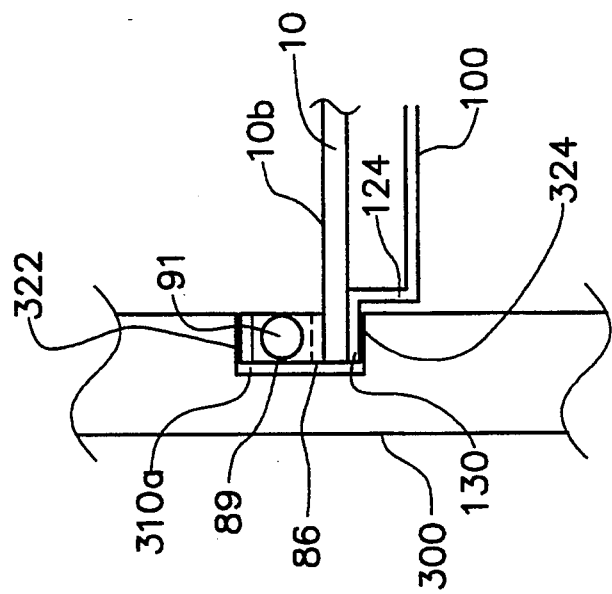
Figure 3C:
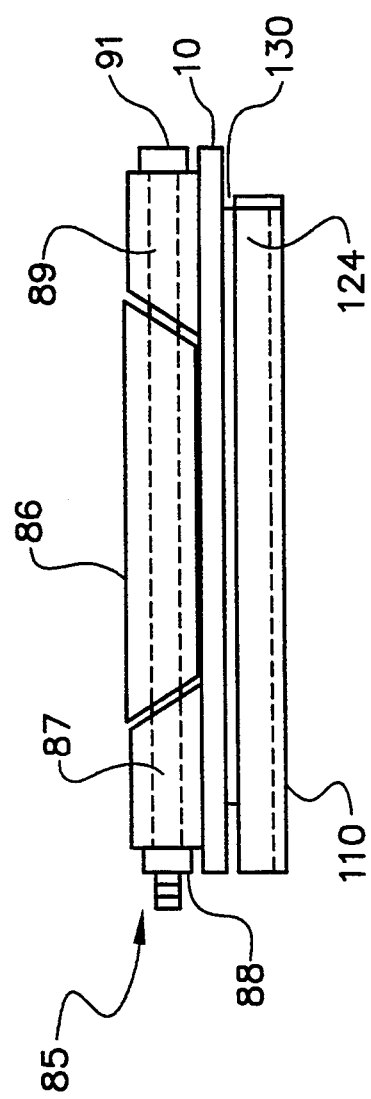

The heat transferring arrangement in accordance with the present invention for a printed wiring board 10 and heat conductive panel 100 is illustrated in FIGS. 3a–c. FIG. 3a is an isometric view showing the installation of two adjacent printed wiring boards in a partial section of chassis 300. FIGS. 3b and 3c are a partial plan view and a partial channel end view, respectively, of the arrangement illustrated in FIG. 3a. Chassis 300 includes a printed wiring board cavity 305 and opposite facing channels or slots 310a and 310b spaced apart and of sufficient height to accommodate the dimensions of the printed wiring board assembly.

As particularly illustrated in FIGS. 3b–c, each channel 310a and 310b (only 310a is shown in the FIGS. 3b–c) includes opposite facing planar channel wall members 322 and 324. The space between channel wall members 322 and 324 must be sufficient to accommodate the thickness of flange member 130 of heat conductive panel 100, the thickness of printed wiring board 10, and the width of wedgelock 85 in the non-expanded or relaxed condition as will be more fully described.

Referring now particularly FIGS. 3b & 3c, and FIG. 1, thereshown is a wedgelock 85 as particularly described in U.S. Pat. No. 5,156,647, entitled "Snap-together wedgelock," issued to Ries." Wedgelock fastening devices are commonly utilized for both commercial and military applications for the purpose of retaining printed wiring boards 10 within a chassis 300 and particularly within a channel 310 within the chassis. Such wedgelocks are shown by the Defense Electronic Supply Center, Dayton, Ohio, Drawing No. 84103, having a code identification number of 14933. Wedgelock 85 is similar in form and function as wedgelock 75, and is illustrated as an alternative which is simpler in design.

Wedgelocks 85 generally comprise a main wedge 86 which is normally adapted such that it may be fastened to a printed wiring board. First and second wedge members 87 and 89 are mounted on a screw assembly. A screw 91 passes longitudinally through the main wedge 86 and first and second wedge members 87 and 89. The second wedge member having a captive nut mounted upon it such that the screw will pass longitudinally therethrough and then through the nut. The main wedge is mounted on a printed wiring board such that when the printed wiring board is inserted into a channel of a chassis, the wedgelock, in relaxed condition, slides in the channel of the chassis. When the screw is tightened, the two wedge members ride upon the main wedge expanding the wedgelock assembly, whereby the printed wiring board is forcibly retained within the channel wall members of the chassis.

In the present invention, the heat transferring arrangement comprises an extension member integral with the heat conductive end member, for example flange member 130, sandwiched between one of the channel wall members 324 and printed wiring board 10 by pressure applied against the printed wiring board side 10b by means of the wedgelock 85 causing the flange member 130 to be in thermally conductive contact with chassis wall member 324.

The heat transferring arrangement as just described, thereby provides a thermal path as follows: Heat from the electrical components on the printed wiring board 10 is transferred by radiation/convection to the heat conductive panel 100 due to the close proximity of the end member 120 to the printed wiring board, and more particularly to the electrical components. The heat from the heat conductive panel 100 is transferred by conduction to the chassis 300 by virtue of the thermally conductive contact between the chassis and the flange member provided by the planar contact of flange member 130 with the planar surface of the wall member 324 of chassis 300. Chassis 300 has generally a high thermal conductivity, therefore wall member 324 is a heat conductive surface. The preceding description is, of course, applicable to both channels 310a and 310b such that heat may be conducted through both flange members 130 and 132 to channel member 324 of both channels 310a and 310b. However, all that is required is at least an extension of the end member 110 be in thermally conductive contact with the chassis.

A low cost heat conductive panel 100 as described, may be made of metal, by common sheet metal techniques. Preferably the side facing the circuit component of the wiring board is black in color, e.g., by anodizing techniques, among others. For applications where weight, conductivity, and cost are issues, aluminum is an excellent choice for the heat conductive panel. The aluminum may be anodized black to increase the surface radiant heat absorbtivity and reduce corrosion. Other coatings may also be used as well. Where weight is not an issue, copper may be used.

As indicated earlier, and particularly illustrated in FIG. 1, a heat conductive foam 111, e.g., a thermally conductive elastomer, may be applied to fill any air space around all or selected electrical components between the printed wiring board 10 and heat conductive panel 100. The conductive foam will therefore provide better cooling of the electrical component by virtue of heat transfer by conduction through the foam 111, housing 100, flange 130, and to the chassis 300.

In addition to the heat transfer benefits associated with the use of the heat conductive panel 100, in accordance with the present invention, structural benefits are also realized. By physically attaching the heat conductive panel 100 directly to printed wiring board 10, and using structural ribs 113, as illustrated in FIG. 1, the stiffness of the printed wiring board 10 may be increased. Further, an optional stand off 114, as generally illustrated in FIGS. 1 and 2, between the end member 120 and printed wiring board 10 also enhances the dynamic structure. As analyzed by a computer model, the addition of one or more standoffs, e.g., one in the center of the printed wiring board (greatest distance from a supported edge) generally fixates the end member 120, thereby limiting deflections and stiffening of the printed wiring board.

In the present invention, the heat conductive panel may be rigidly attached to the printed wiring board by fastening the flanges to the printed wiring board by any fastening technique, e.g., rivets, known in the art. Alternatively, the heat conductive panel may be loosely located on the printed wiring board by the locating technique described earlier, and the exemplary combination of the panel-board-wedgelock may be inserted into the chassis channel for subsequent expansion of the wedgelock to cause the thermally conductive contact of the flange member with the chassis.

Attachment of the heat conductive panel as described herein with structural ribs 113 and a central stand off 114 provides a direct means of supporting the printed wiring board without requiring additional hardware or significant printed wiring board space. This is particularly true for design of surface mount technology printed wiring boards which are restricted to certain printed wiring board widths or require additional hardware, (i.e., stiffeners) to be attached to limit deflections. With the heat conductive panel of the present invention, printed wiring board assembly deflections and vibrations are minimized and thereby reduces solder joint failures which are most commonly caused from large part vs. printed wiring board deflections and thermal cycling for both surface mount technology components and through-hole components.

While there has been shown and described specific embodiments of this invention, further modifications and improvements will appear to those skilled in the art. A wedgelock has been utilized to apply a force against the printed wiring board so that the planar flange member 130 of the heat conductive panel makes a thermally conductive contact with the channel wall member 324 of chassis 300 so that heat may be transferred through conduction from one or both heat conductive panel flange members 130 and 132 to the chassis 300. It should be obvious to those skilled in the art that other techniques are possible for applying such force to the printed wiring board so as to provide a thermally conductive path from the flange member to the chassis, and are within the scope of the present invention.

Although the drawings have shown generally rectangular shaped members having planar surfaces, other shapes and surfaces are within the spirit and scope of the present invention. More specifically, it is of paramount importance that the flange, or flange members of the heat conductive panel make a thermally conductive surface contact with the chassis in order to provide the thermally conductive path. Thus, other shapes other than planar or rectangular are within the true spirit and scope of the present invention.

The drawings have generally shown a panel which covers most of the component side of the printed wiring board. The application of the heat conductive panel member in accordance with the present invention is very flexible and can be easily adapted to solve a variety of electronic cooling problems. It can be optimized in shape/form for most beneficial heat transfer without requiring limitations to component placement. For example, if a printed wiring board had only one hot component near the bottom corner of the board, it would not be necessary to use an entire panel as illustrated, but rather only the bottom corner. Further, the panel end member may also be bent down over hot components so less conductive foam is required and the thermal resistance is decreased. Also, a lip or extension member may be provided, extending from the panel end member, to be in thermally conductive contact with the chassis, directly or through a thermal foam on the lip, to transfer heat to the top of the chassis.

In some circumstances, only a single flange member may be desirable with the panel cantilevered over selected components and the flange secured to only one side of the printed wiring board and in thermally conductive contact with the chassis. Still alternatively, flange members may be eliminated altogether, with the panel having at least a portion thereof in thermally conductive contact with the chassis. Thus, there are many arrangements, in accordance with the true spirit and scope of the present invention.

Lastly, although the illustrations have shown a printed wiring board having components on one side thereof, and enclosed by a single heat conductive panel, the present invention may also be applied to printed wiring boards having components on each side thereof with a heat conductive panel on both sides of the printed wiring board in a manner as has been shown and described. In this situation, a means must be provided for providing a thermally conductive path from the heat conductive panel to the chassis. This may be accomplished for example, by sandwiching the combination of flange-member/printed wiring board/flange-member with the wedgelock directly in contact with one of the flange members.

The embodiments of an invention in which an exclusive property or right is claimed are defined as follows:

1. Apparatus for conducting heat away from a component mounted on a printed circuit board to a chassis, said printed circuit board having first and second edge portions:

first and second channels formed in said chassis a thermally conductive cover member having a first surface extending generally over the printed circuit board and in close proximity to the component, said cover having first and second walls extending downwardly toward the printed circuit board with each wall including a flange extending outwardly from the walls and in contact with the first and second edge portions of said printed circuit board; and wedging means for wedging the first and second edge portions and the first and second flanges together into the first and second channels respectively so that the printed circuit board with the cover is fixedly mounted to the chassis and a thermal path from the component through the cover and the walls and flanges to the chassis is provided.

2. Apparatus according to claim 1 further including a heat conducting space filler in physical contact with the component and with the cover.

3. Apparatus according to claim 1 wherein the cover includes third and fourth walls extending downwardly toward the printed circuit board, said third and fourth walls terminating before contacting the printed circuit board so as to allow air flow over the printed circuit board and help prevent access to foreign objects.

4. Apparatus according to claim 1 further including a stand off connecting the cover to the printed circuit board to provide additional rigidity and proper spacing to the combination.

* * * * *